(12) United States Patent
Liu et al.

(10) Patent No.: US 12,223,909 B2
(45) Date of Patent: Feb. 11, 2025

(54) PIXEL DRIVE CIRCUIT, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tingliang Liu, Beijing (CN); Huijuan Yang, Beijing (CN); Linhong Han, Beijing (CN); Xiaoqing Shu, Beijing (CN); Maoying Liao, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/282,242

(22) PCT Filed: Nov. 23, 2021

(86) PCT No.: PCT/CN2021/132462
§ 371 (c)(1),
(2) Date: Sep. 15, 2023

(87) PCT Pub. No.: WO2022/199084
PCT Pub. Date: Sep. 29, 2022

(65) Prior Publication Data
US 2024/0161699 A1 May 16, 2024

(30) Foreign Application Priority Data

Mar. 25, 2021 (CN) .......................... 202110322033.8

(51) Int. Cl.
*G09G 3/3258* (2016.01)

(52) U.S. Cl.
CPC ... *G09G 3/3258* (2013.01); *G09G 2300/0819* (2013.01); *G09G 2300/0842* (2013.01);
(Continued)

(58) Field of Classification Search
CPC ......... G09G 3/3258; G09G 2300/0819; G09G 2300/0842; G09G 2300/0861;
(Continued)

(56) References Cited

U.S. PATENT DOCUMENTS 7,893,625 B2 2/2011 Suh et al.
10,431,154 B2 10/2019 Tsai et al.
(Continued)

FOREIGN PATENT DOCUMENTS

CN 1599531 A 3/2005
CN 107103882 A 8/2017
(Continued)

OTHER PUBLICATIONS

International Search Report and Written Opinion mailed on Feb. 11, 2022, in corresponding PCT/CN2021/132462, 8 pages.
(Continued)

*Primary Examiner* — Matthew A Eason
*Assistant Examiner* — Chayce R Bibbee
(74) *Attorney, Agent, or Firm* — XSENSUS LLP

(57) ABSTRACT

A pixel driving circuit includes: a driving transistor connected to a first node, a second node and a third node; a first light-emitting control unit connected to the second node; a second light-emitting control unit connected to the third node and a fourth node; a first reset unit connected to the fourth node, and configured to load a second power supply voltage to the fourth node in response to a scan signal. One end of the light-emitting element is connected to the fourth
(Continued)

node, and the other end of the light-emitting element is used for loading the second power supply voltage.

18 Claims, 6 Drawing Sheets

(52) U.S. Cl.
CPC ............... *G09G 2300/0861* (2013.01); *G09G 2320/0233* (2013.01); *G09G 2320/0242* (2013.01); *G09G 2320/0626* (2013.01)

(58) Field of Classification Search
CPC ... G09G 2320/0233; G09G 2320/0242; G09G 2320/0626; G09G 3/3233; G09G 3/3208
See application file for complete search history.

(56) References Cited

U.S. PATENT DOCUMENTS

| | | | |
|---|---|---|---|
| 10,810,934 B2 | 10/2020 | Pyo et al. | |
| 10,957,257 B2 | 3/2021 | Ma | |
| 2003/0103022 A1 | 6/2003 | Noguchi et al. | |
| 2004/0257353 A1* | 12/2004 | Imamura | G09G 3/3241 345/204 |
| 2005/0057461 A1* | 3/2005 | Suh | G09G 3/3225 345/76 |
| 2013/0241916 A1* | 9/2013 | Takasugi | G09G 3/3291 345/212 |
| 2014/0145917 A1 | 5/2014 | Kwak | |
| 2017/0365214 A1 | 12/2017 | Tsai et al. | |
| 2018/0144684 A1 | 5/2018 | Jeon et al. | |
| 2019/0066598 A1 | 2/2019 | Kim et al. | |
| 2019/0266941 A1* | 8/2019 | Pyo | G09G 3/3225 |
| 2020/0320934 A1 | 10/2020 | Ma | |
| 2020/0394950 A1 | 12/2020 | Oh et al. | |

FOREIGN PATENT DOCUMENTS

| | | |
|---|---|---|
| CN | 109599062 A | 4/2019 |
| CN | 113066435 A | 7/2021 |

OTHER PUBLICATIONS

Office Action issued on Nov. 26, 2021, in corresponding Chinese patent Application No. 202110322033.8, 22 pages.

* cited by examiner

PIXEL DRIVE CIRCUIT, DISPLAY PANEL AND DISPLAY DEVICE

CROSS REFERENCE

This disclosure is based upon International Application No. PCT/CN2021/132462, filed on Nov. 23, 2021, which claims priority to Chinese patent application No. 202110322033.8, filed on Mar. 25, 2021, entitled "Pixel Drive Circuit, Display Panel and Display Device," the entire content of which is incorporated by reference in its entirety This article.

TECHNICAL FIELD

The present disclosure relates to present disclosure relates to the field of display technology, in particular, to a pixel driving circuit, a display panel and a display device.

BACKGROUND

In some organic light emitting diode (OLED) display panels, an initialization lead can be provided to initialize the pixel electrodes of the OLED, and an initialization voltage can be applied to the initialization lead.

It should be noted that, information disclosed in the above background portion is provided only for better understanding of the background of the present disclosure, and thus it may contain information that does not form the prior art known by those ordinary skilled in the art.

SUMMARY

The objective of the present disclosure is to provide a pixel driving circuit, a display panel and a display device.

According to one aspect of the present disclosure, a pixel driving circuit is provided, including:
- a driving transistor connected to a first node, a second node and a third node, and configured to output a driving current to the third node under control of the first node;
- a storage capacitor, including one terminal connected to the first node;
- a data writing unit, connected to the second node, and configured to load a data voltage to the second node in response to a scan signal;
- a threshold compensation unit, connected to the first node and the third node, and configured to conduct the first node and the third node in response to the scan signal;
- a first light emitting control unit, connected to the second node, and configured to apply a first power supply voltage to the second node in response to a light emitting control signal;
- a second light emitting control unit, connected to the third node and a fourth node, and configured to conduct the third node and the fourth node in response to the light emitting control signal;
- a first reset unit, connected to the fourth node, and configured to apply a second power supply voltage to the fourth node in response to the scan signal; and
- a light emitting element, one terminal of the light emitting element is connected to the fourth node, and the other terminal is configured to load the second power supply voltage.

According to an implementation of the present disclosure, the data writing unit includes a data writing transistor, the data writing transistor has a first terminal, a second terminal and a control terminal, the first terminal of the data writing transistor is configured to load the data voltage, the second terminal of the data writing transistor is connected to the second node, and the control terminal of the data writing transistor is configured to load the scan signal;

the threshold compensation unit includes a threshold compensation transistor, the threshold compensation transistor has a first terminal, a second terminal and a control terminal, the first terminal of the threshold compensation transistor is connected to the first node, the second terminal of the threshold compensation transistor is connected to the third node, and the control terminal of the threshold compensation transistor is configured to load the scan signal;

the first light emitting control unit includes a first light emitting control transistor, the first light emitting control transistor has a first terminal, a second terminal and a control terminal, and the first terminal of the first light emitting control transistor is configured to load the first power supply voltage, the second terminal of the first light emitting control transistor is connected to the second node, and the control terminal of the first light emitting control transistor is configured to load the light emitting control signal;

the second light emitting control unit includes a second light emitting control transistor, the second light emitting control transistor has a first terminal, a second terminal and a control terminal, and the first terminal of the second light emitting control transistor is connected to the third node, the second terminal of the second light emitting control transistor is connected to the fourth node, and the control terminal of the second light emitting control transistor is configured to load the light emitting control signal; and the first reset unit includes a first reset transistor, the first reset transistor has a first terminal, a second terminal and a control terminal, the first terminal of the first reset transistor is configured to load the second power supply voltage, the second terminal of the first reset transistor is connected to the fourth node, and the control terminal of the first reset transistor is configured to load the scan signal.

According to an implementation of the present disclosure, the pixel driving circuit further includes a second reset unit, connected to the first node and configured to apply an initialization voltage to the first node in response to a reset signal.

According to another aspect of the present disclosure, there is provided a display panel, which includes the above pixel driving circuit.

According to an implementation of the present disclosure, the display panel includes a display area and a peripheral area surrounding the display area; and the display panel includes a second power supply lead configured to load the second power supply voltage in the display area, and the second power supply lead is electrically connected to the fourth node of the pixel driving circuit.

According to an implementation of the present disclosure, a number of the second power supply lead is plural, and the second power supply lead extends along a row direction or along a column direction.

According to an implementation of the present disclosure, the second power supply lead includes a plurality of second power supply row sub-leads extending in a row direction and a plurality of second power supply column sub-leads extending in a column direction; and wherein the second power supply row sub-leads and the second power supply column sub-leads are connected to each other, to cause respective second power supply lead to be in a grid shape.

According to an implementation of the present disclosure, the peripheral area includes a second power supply bus, and the second power supply bus is connected to at least part of the second power lead.

According to an implementation of the present disclosure, the peripheral area has a binding area; the second power supply bus has a wiring segment and a connecting segment connected to each other; a number of the second power supply bus is two, the wiring segments of the two second power supply buses are all extend along the column direction and are respectively located on two sides of the display area; and the connecting segment of the second power supply bus extends to the bonding area.

According to an implementation of the present disclosure, the wiring segment of the second power supply bus is located at an end of the display panel close to the bonding area.

According to an implementation of the present disclosure, the pixel driving circuit includes a second reset unit, and the peripheral area of the display panel includes a binding area; the display panel is further configured with:
- an initialization bus, configured to load the initialization voltage; a number of the initialization bus is two and are disposed in the peripheral area, and the initialization bus includes a wiring segment and a connecting segment connected to each other; the wiring segments of the two initialization buses are all extend along the column direction and are respectively located on two sides of the display area; and the connecting segment of the initialization bus extends to the bonding area;
- an initialization lead, running through the display area along a row direction and connected to the wiring segment of the initialization bus;
- a first power supply bus, configured to load the first power supply voltage; a number of the first power supply buses is two and are disposed in the peripheral area, one terminal of the first power supply bus is extended to the bonding area; and
- a first power lead, arranged in the display area and distributed in a grid, and connected to the first power supply bus;
- wherein the first power supply bus is partially overlapped with the initialization bus.

According to another aspect of the present disclosure, there is provided a display device, which includes the above display panel.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

Figure 1:
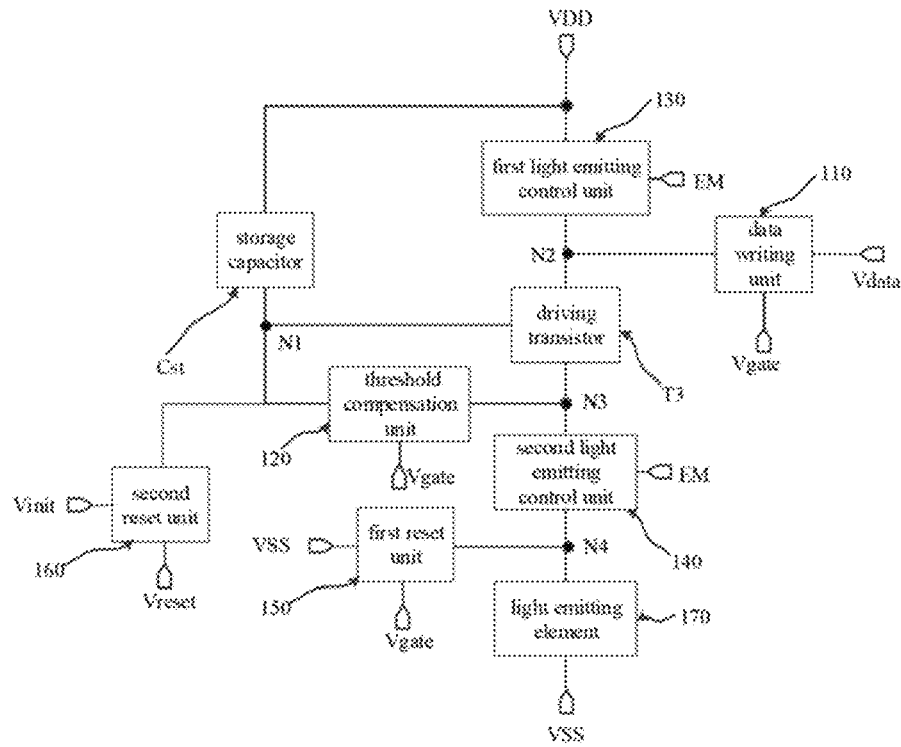
FIG. 1 is a schematic structural diagram of a pixel driving circuit provided by the present disclosure.

EXPLANATION OF REFERENCE SYMBOLS 110. data writing unit; 120. threshold compensation unit; 130. first light emitting control unit; 140. second light emitting control unit; 150. first reset unit; 160. second reset unit; 170. light emitting element; 210. scan lead; 220, data lead; 231, first power supply lead; 232, first power supply bus; 240, light emitting control lead; 251, second power supply lead; 2511, second power supply row sub-lead; 2512, second power supply column sub-lead; 252, second power supply bus; 2521, wiring segment of the second power supply bus; 2522, connecting segment of the second power supply bus; 261, initialization lead; 262, initialization bus; 2621, wiring segment of the initialization bus; 2622, connecting segment of the initialization bus; 270, reset control lead; 310, circuit board; 320, driver chip; T1, second reset transistor; T2, threshold compensation transistor; T3, driving transistor; T4, data writing transistor; T5, first light emitting control transistor; T6, second light emitting control transistor; T7, first reset transistor; Cst, storage capacitor; Vgate, scan signal; Vdata, data voltage; EM, light emitting control signal; VDD, first power supply voltage; VSS, second power supply voltage; Vinit, initialization voltage; Vreset, reset control signal; N1, first node; N2, second node; N3, third node; N4, fourth node; A, row direction; B, column direction; C, peripheral area; D, display area; E, binding area; F, through hole.

DETAILED DESCRIPTION

Example embodiments will now be described more fully with reference to the accompanying drawings. Example embodiments may, however, be embodied in many forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component illustrated in the figure to another component, these terms are used in this specification only for convenience, for example, according to the direction of the example shown in the accompanying drawings. It will be appreciated that if the illustrated device is turned over so that it is upside down, then elements described as being "upper" will become elements that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "include" and "have" are used to indicate an open-ended inclusive and mean that there may be additional elements/components/etc. in addition to those listed; the terms "first", "second", "third" etc. are only used as a marker, not a limit on the number of its objects.

In the present disclosure, a transistor refers to an element including at least three terminals of a gate, a drain, and a source. A transistor has a channel region between the drain (drain terminal, drain region, or drain electrode) and source (source terminal, source region, or source electrode), and current can flow through the drain, channel region, and source. The channel region refers to a region through which current mainly flows. In cases where transistors of opposite types are used, or when the direction of current changes during circuit operation, the functions of "source" and "drain" may be interchanged. Therefore, in the present disclosure, "source" and "drain" can be interchanged with each other. Structurally, the transistor can have a first terminal, a second terminal and a control terminal, wherein the gate of the transistor can be used as the control terminal of the transistor; one of the source and the drain of the transistor can be used as the first terminal of the transistor, and the other can be used as the second terminal of the transistor.

In this disclosure, the "on" state of a transistor refers to a state in which the source and drain of the transistor are electrically connected. The "off" state of the transistor refers to a state in which the source and the drain of the transistor are electrically disconnected; it can be understood that when the transistor is turned off, leakage current may still exist.

In some organic light emitting diode (OLED) display panels, an initialization lead is provided to initialize the pixel electrodes of the OLED, and an initialization voltage can be applied to the initialization lead. However, along the direction away from the source driver of the display panel, there is a voltage drop in the initialization voltage, the driving voltage and the common voltage, and the voltage of the pixel electrode of the OLED is directly related to the driving current flowing through the OLED. This results in a brightness difference between the end of the OLED display panel close to the source driver and the end far away from the source driver.

Furthermore, when the display panel is provided with through holes, the OLED display panel will have more obvious color spots (mura) in the row area where the through holes are located. The mura is more obvious in a low grayscale state, which has a greater impact on a low grayscale picture.

The disclosure provides a pixel driving circuit and a display panel using the pixel driving circuit, so as to improve the brightness uniformity of the display panel.

Referring to FIG. 1, the pixel driving circuit includes:
a driving transistor T3, connected to a first node N1, a second node N2 and a third node N3, and is configured to output a driving current to the third node N3 under the control of the first node N1;
a storage capacitor Cst, having one terminal connected to the first node N1;
a data writing unit 110, connected to the second node N2, and is configured to load a data voltage Vdata to the second node N2 in response to a scan signal Vgate;
a threshold compensation unit 120, connected to the first node N1 and the third node N3, and is configured to cause conduction between the first node N1 and the third node N3 in response to the scan signal Vgate;
a first light emitting control unit 130, connected to the second node N2, and is configured to load a first power supply voltage VDD to the second node N2 in response to a light emitting control signal EM;
a second light emitting control unit 140, connected to the third node N3 and the fourth node N4, and is configured to conduct between the third node N3 and the fourth node N4 in response to the light emitting control signal EM;
a first reset unit 150, connected to a fourth node N4, and is configured to load a second power supply voltage VSS to the fourth node N4 in response to the scan signal Vgate; and
a light emitting element 170, having one terminal connected to the fourth node N4, and the other configured to load the second power supply voltage VSS.

According to the pixel driving circuit provided in the present disclosure, one terminal of the light emitting element 170 is used to load the second power supply voltage VSS, and the other terminal is reset by the second power supply voltage VSS. In this way, when the pixel driving circuit is applied to a display panel, the pixel driving circuit avoids the situation of using the initialization voltage to reset the light-emitting element 170, reduces the difference in the source-drain voltage difference of the driving crystal points at different positions, improves the uniformity of the operating environment of the driving transistor T3, thereby improving the brightness uniformity of the display panel.

Hereinafter, the structure, principle and effect of the pixel driving circuit provided by the present disclosure will be further explained and described in conjunction with the accompanying drawings.

Figure 3:
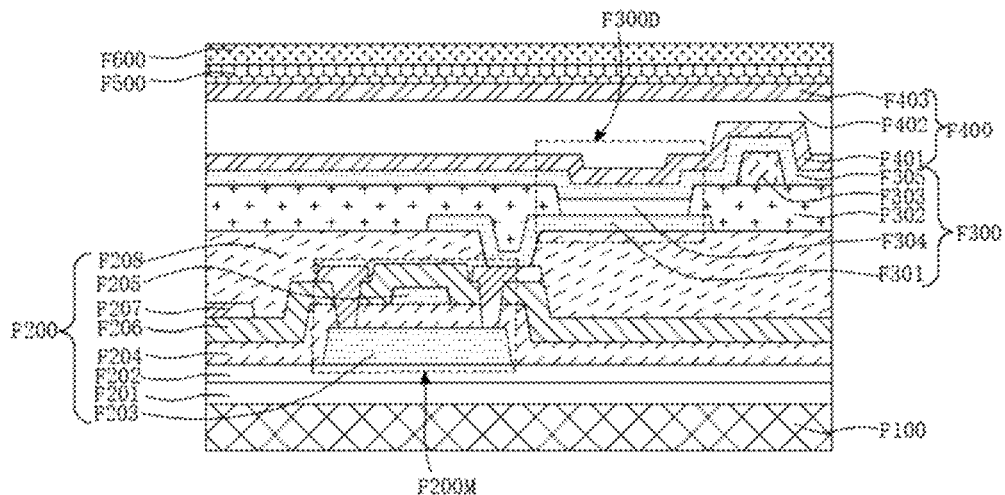
FIG. 3 is a schematic structural diagram of a display panel provided by the present disclosure.
Figure 4:
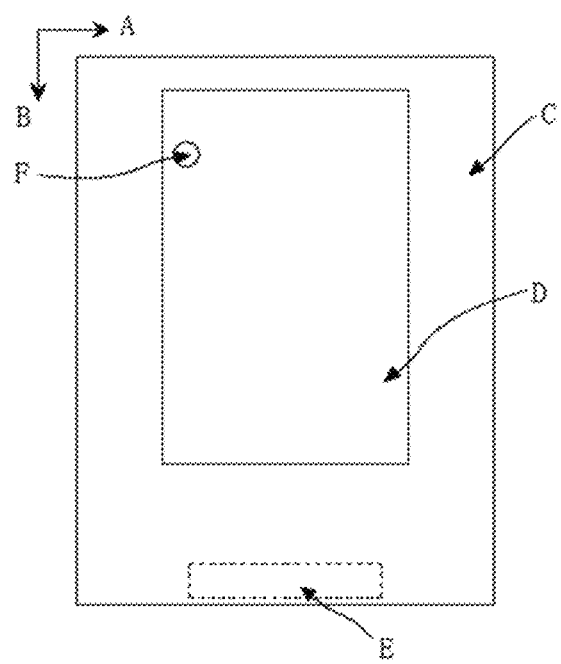
FIG. 4 is a schematic structural diagram of a display panel provided by the present disclosure.

Referring to FIG. 3 and FIG. 4, the pixel driving circuit provided by the present disclosure can be applied to a display panel, and the display panel can include a display area D and a peripheral area C surrounding the display area D. In the embodiment, the pixel driving circuit can be arranged in the display area D, especially arranged in an array in the display area D; the light emitting element 170 of the pixel driving circuit can be used as a sub-pixel of the display panel. A binding area E may be provided in the peripheral area C, and the binding area E is used for binding a circuit board or a driver chip.

In an implementation manner of the present disclosure, the display panel can be bound with a driving chip through a COP (chip on panel) technology. The binding area E may include a chip binding area and a circuit board binding area, the chip binding area is provided with a chip binding pad for binding with the driver chip, and the circuit board binding area is provided with a circuit board binding pad for binding with the circuit board.

In another implementation manner of the present disclosure, the display panel may also be bound with a driving chip through a COF (chip on film) technology. Wherein, the binding area E includes a circuit board binding area, and a circuit board binding pad for binding with the COF is arranged in the circuit board binding area, and a driver chip can be bound to the COF.

It can be understood that the display panel can also be bound to the driving chip by other methods, for example, the display panel is bound to a flexible circuit board and the driving chip is bound to the flexible circuit board, which is not limited in the present disclosure.

Optionally, the light emitting element 170 of the present disclosure may be an organic electroluminescence diode (OLED).

Optionally, referring to FIG. 3, the display panel may include a base substrate F100, a circuit layer F200 and a pixel layer F300 which are stacked in sequence.

The base substrate F100 may be a base substrate F100 of inorganic material, or may be a base substrate F100 of organic material. For example, in one embodiment of the present disclosure, the material of the base substrate F100 can be glass materials such as soda-lime glass, quartz glass, sapphire glass, or can be metallic material such as stainless steel, aluminum, nickel, etc. In another embodiment of the present disclosure, the material of the substrate F100 may be Polymethyl methacrylate (PMMA), Polyvinyl alcohol (PVA), Polyvinyl phenol (PVP), Polyether sulfone (PES), polyimide, polyamide, polyacetal, Polycarbonate (PC), Polyethylene terephthalate (PET), Polyethylene naphthalate (PEN) or a combination thereof. In another embodiment of the present disclosure, the base substrate F100 may also be a flexible base substrate F100, for example, the material of the base substrate F100 may be polyimide (PI). The base substrate F100 can also be a composite of multi-layer materials. For example, in one embodiment of the present disclosure, the base substrate F100 can include a bottom film, a pressure-sensitive adhesive layer, a first polyimide layer and a second polyimide layer.

Optionally, various units, driving transistors and storage capacitors of the pixel driving circuit of the present disclosure are arranged in the circuit layer F200. Further, each power supply in the pixel driving circuit may include a transistor F200M and a storage capacitor. Further, the transistor F200M can be a thin film transistor, and the thin film transistor can be a top gate thin film transistor, a bottom gate thin film transistor or a double gate thin film transistor; the material of the active layer of the thin film transistor can be amorphous silicon semiconductor material, low temperature polysilicon semiconductor materials, metal oxide semiconductor materials, organic semiconductor materials or other types of semiconductor materials; the thin film transistors may be N-type thin film transistors or P-type thin film transistors. In one embodiment of the present disclosure, the thin film transistor is a low temperature polysilicon transistor.

It can be understood that, among the various transistors of the circuit layer F200, the types of any two transistors may be the same or different. Exemplarily, in an implementation manner, in a pixel driving circuit, some transistors may be N-type transistors and some transistors may be P-type transistors. As another example, in another embodiment of the present disclosure, in a pixel driving circuit, the material of the active layer of some transistors may be low-temperature polysilicon semiconductor material, and the material of the active layer of some transistors may be metal oxide semiconductor materials.

The transistor may have a first terminal, a second terminal and a control terminal, one of the first and second terminals may be the source of the transistor and the other may be the drain of the transistor, and the control terminal may be the gate of the transistor. It can be understood that the source and the drain of the transistor are two opposite concepts that can be interchanged; when the working state of the transistor changes, for example, the direction of the current changes, the source and the drain of the transistor can be interchanged.

Optionally, the circuit layer F200 may include a semiconductor layer F203, a gate insulating layer F204, a gate layer F205, an interlayer dielectric layer F206, and a source-drain metal layer F207 stacked between the base substrate F100 and the pixel layer F300. Each thin film transistor and storage capacitor can be formed of film layers such as semiconductor layer F203, gate insulating layer F204, gate layer F205, interlayer dielectric layer F206, and source-drain metal layer F207. Wherein, the positional relationship of each film layer can be determined according to the film layer structure of the thin film transistor. For example, in one embodiment of the present disclosure, the circuit layer F200 may include a semiconductor layer F203, a gate insulating layer F204, a gate layer F205, an interlayer dielectric layer F206, and a source-drain metal layer F207, which are sequentially stacked. The thin film transistor thus formed is a top-gate thin film transistor. For another example, in another embodiment of the present disclosure, the circuit layer F200 may include a gate layer F205, a gate insulating layer F204, a semiconductor layer F203, an interlayer dielectric layer F206, and a source-drain metal layer F207 stacked in sequence, and the thin film transistor thus formed is a bottom gate thin film transistor.

In some embodiments, the circuit layer F200 can also adopt a double gate layer F205 structure, that is, the gate layer F205 can include a first gate layer and a second gate layer, and the gate insulating layer F204 can include a first gate insulating layer for isolating the semiconductor layer F203 and the first gate layer, and a second gate insulating layer for isolating the first gate layer and the second gate layer. For example, in one embodiment of the present disclosure, the circuit layer F200 may include a semiconductor layer F203, a first gate insulating layer, a first gate layer, a second gate insulating layer, a second gate layer, an interlayer dielectric layer F206 and a source-drain metal layer F207.

In some embodiments, the circuit layer F200 can also adopt a structure of a double source-drain metal layer F207, that is, the source-drain metal layer F207 can include a first source-drain metal layer and a second source-drain metal layer, and the interlayer dielectric layer F206 can include a first interlayer dielectric layer located on the side of the first source-drain metal layer close to the substrate F100 and a second interlayer dielectric layer located between the first source-drain metal layer and the second source-drain metal layer.

Optionally, the circuit layer F200 may further include a passivation layer, and the passivation layer may be disposed on the surface of the source-drain metal layer F207 away from the base substrate F100 to protect the source-drain metal layer F207.

Optionally, the circuit layer F200 may also include a buffer material layer disposed between the base substrate F100 and the semiconductor layer F203, and the semiconductor layer F203, the gate layer F205, etc. are located on the side of the buffer material layer away from the base substrate F100. The material of the buffer material layer may be inorganic insulating materials such as silicon oxide and silicon nitride. The buffer material layer can be one layer of inorganic material, or an inorganic material layer stacked in multiple layers. Exemplarily, in one embodiment of the present disclosure, referring to FIG. 3, the buffer material layer may include a barrier layer F201 on the side close to the base substrate F100 and a buffer layer F202 on the side of the barrier layer F201 away from the base substrate F100. The barrier layer F201 is used to prevent the ions and other components in the substrate F100 from penetrating into the circuit layer F200, so that the circuit layer F200 maintains stable performance. The buffer layer F202 can improve the bonding force between the circuit layer F200 and the base substrate F100, and provide a stable environment for the circuit layer F200.

Optionally, the circuit layer F200 may also include a planarization layer F208 located between the source-drain metal layer F207 and the pixel layer F300. The planarization layer F208 may provide a planarized surface for the pixel electrode. Optionally, the material of the planarization layer F208 may be an organic material.

Optionally, the pixel layer F300 may be disposed on the side of the circuit layer F200 away from the base substrate F100, and the light emitting element of the pixel driving circuit of the present disclosure may be disposed at the pixel layer F300. Optionally, the pixel layer F300 may include a pixel electrode layer F301, a pixel definition layer F302, a support pillar layer F303, an organic light-emitting functional layer F304 and a common electrode layer F305 which are stacked in sequence. In the embodiment, the pixel electrode layer F301 has a plurality of pixel electrodes in the display area of the display panel; the pixel definition layer F302 has a plurality of penetrated pixel openings corresponding to the plurality of pixel electrodes in the display area, and any pixel opening exposes at least a partial area of the corresponding pixel electrode. The support pillar layer F303 includes a plurality of support pillars in the display area, and the support pillars are located on the surface of the pixel definition layer F302 away from the base substrate F100, so as to support a fine metal mask (FMM) during the evaporation process. The organic light emitting functional layer F304 at least covers the pixel electrodes exposed by the pixel definition layer F302. In the embodiment, the organic light-emitting functional layer F304 may include an organic electroluminescent material layer, and may include one or more of a hole injection layer, a hole transport layer, an electron blocking layer, a hole blocking layer, an electron transport layer, and an electron injection layer. Each film layer of the organic light-emitting functional layer F304 can be prepared by an evaporation process, and a fine metal mask or an open mask can be used to define the pattern of each film layer during evaporation. The common electrode layer F305 can cover the organic light-emitting functional layer F304 in the display area. In this way, the pixel electrode, the common electrode layer F305 and the organic light-emitting functional layer F304 between the pixel electrode and the common electrode layer F305 form an organic light-emitting diode, and any organic light-emitting diode can be used as a sub-pixel of the display panel.

In some embodiments, the pixel layer F300 may also include a light extraction layer located on the side of the common electrode layer F305 away from the base substrate F100 to enhance the light extraction efficiency of the organic light emitting diode.

Optionally, the display panel may further include a thin film encapsulation layer F400. The thin film encapsulation layer F400 is disposed on the surface of the pixel layer F300 away from the base substrate F100, and may include alternately stacked inorganic encapsulation layers and organic encapsulation layers. In the embodiment, the inorganic encapsulation layer can effectively block moisture and oxygen from the outside, preventing water and oxygen from invading the organic light-emitting functional layer F304 and causing material degradation. Alternatively, the edge of the inorganic encapsulation layer may be located in the peripheral area. The organic encapsulation layer is located between two adjacent inorganic encapsulation layers, so as to realize planarization and weaken the stress between the inorganic encapsulation layers. In the embodiment, the edge of the organic encapsulation layer may be located between the display area and the edge of the inorganic encapsulation layer. Exemplarily, the thin film encapsulation layer F400 includes a first inorganic encapsulation layer F401, an organic encapsulation layer F402 and a second inorganic encapsulation layer F403 sequentially stacked on the side of the pixel layer F300 away from the base substrate F100.

Optionally, the display panel may also include an anti-reflection layer F500. The anti-reflection layer F500 may be disposed on a side of the film encapsulation layer F400 away from the pixel layer F300 to reduce the reflection of ambient light by the display panel, thereby reducing the impact of ambient light on the display effect. In one embodiment of the present disclosure, the anti-reflection layer F500 may include a color filter layer and a black matrix layer that are stacked, so that reducing of the light transmittance of the display panel can be avoided while the ambient light interference is reduced. In another embodiment of the present disclosure, the antireflection layer F500 may be a polarizer, such as a patterned coated circular polarizer.

Optionally, the display panel may further include a touch function layer F600, which is disposed on a side of the thin film encapsulation layer F400 away from the base substrate F100 for realizing touch operation of the display panel. In one embodiment of the present disclosure, the touch function layer F600 may be disposed between the thin film encapsulation layer F400 and the antireflection layer F500.

Figure 6:
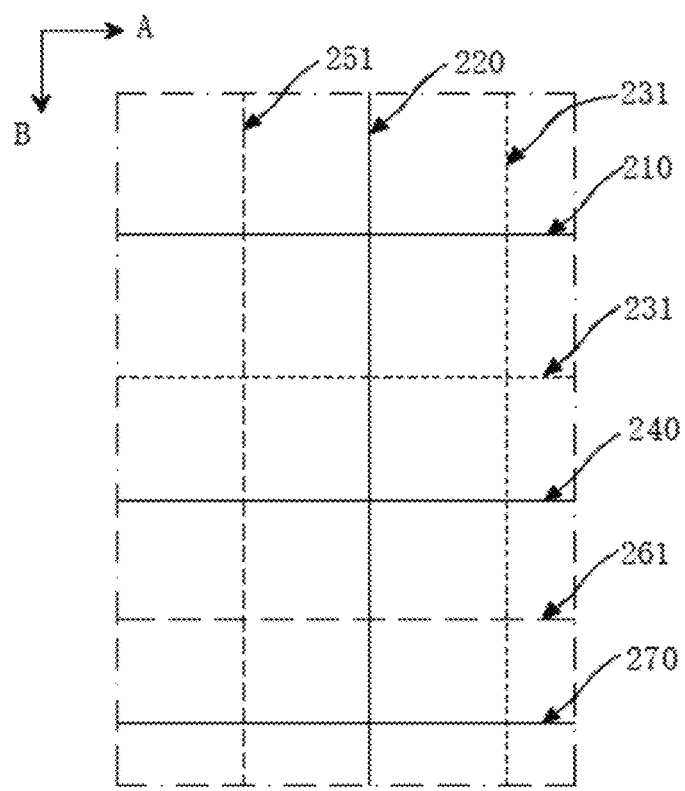
FIG. 6 is a schematic diagram of a partial structure of a display panel in a region of a pixel driving circuit provided by the present disclosure, in which only part of the leads are shown.
Figure 7:
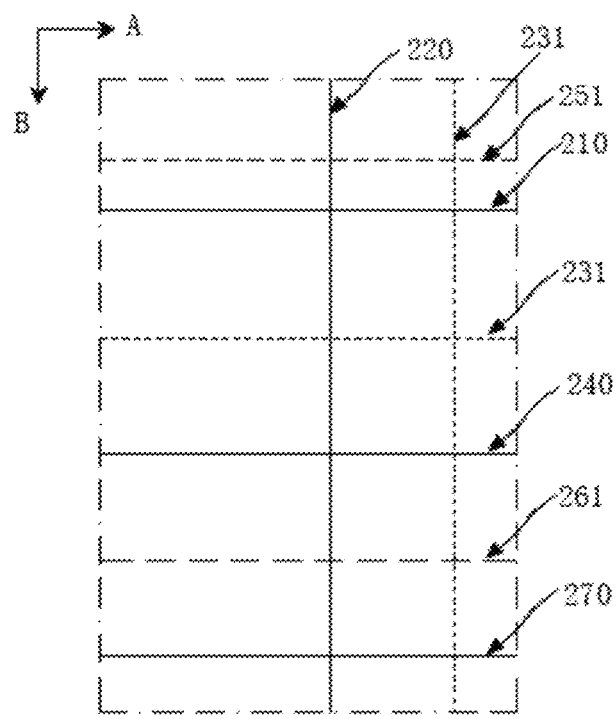
FIG. 7 is a schematic diagram of a partial structure of a display panel in a region of a pixel driving circuit provided by the present disclosure, in which only part of the leads are shown.
Figure 8:
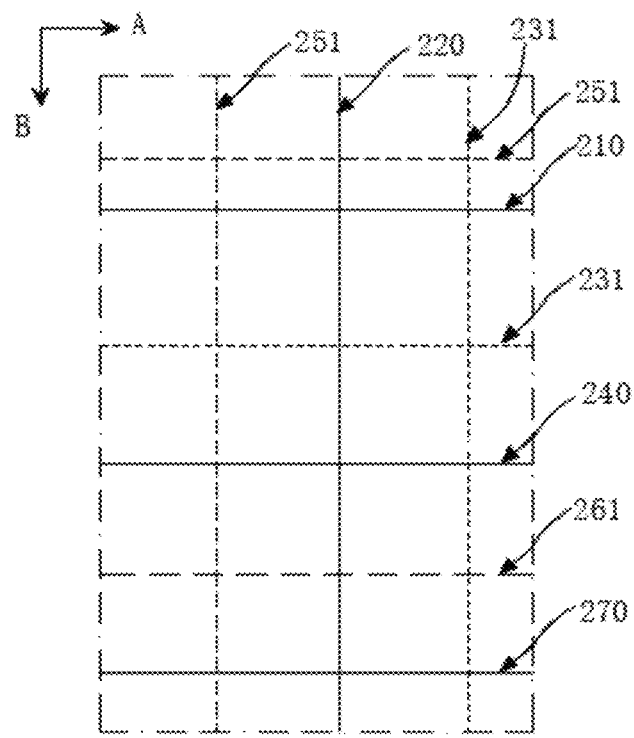
FIG. 8 is a schematic diagram of a partial structure of a display panel in a region of a pixel driving circuit provided by the present disclosure, in which only part of the leads are shown.

Optionally, referring to FIGS. 6 to 8, the display panel has a data lead 220 formed on the source and drain metal layer. The data lead 220 may extend along the column direction B and be electrically connected to the data writing unit 110 for loading the data voltage Vdata to the data writing unit 110.

Optionally, referring to FIGS. 6 to 8, the display panel is provided with a scan lead 210 on the gate layer. The scan lead 210 is extended along the row direction A and is used to load the scan signal Vgate. The scan lead 210 may be electrically connected to the data writing unit 110, the threshold compensation unit 120 and the first reset unit 150.

Optionally, referring to FIG. 6 to FIG. 8, the display panel is provided with an emission control lead 240 on the gate layer, and the emission control lead 240 is extended along the row direction A and is used for loading an emission control signal EM. The light emitting control lead 240 can be electrically connected with the first light emitting control unit 130 and the second light emitting control unit 140.

Optionally, referring to FIG. 6 to FIG. 8, the display panel is provided with a first power supply lead 231 on the circuit layer, and the first power supply lead 231 is used to load the first power supply voltage VDD. The first power lead 231 may be connected to the first light emitting control unit 130 to load the first power supply voltage VDD to the first light emitting control unit 130. Further, the first power supply lead 231 is arranged in the display area D and distributed in a grid, so that the uniformity of the first power supply voltage VDD on the first power supply leads 231 can be improved.

In one embodiment of the present disclosure, the first power lead 231 is disposed at the source-drain metal layer. In another embodiment of the present disclosure, the first power lead 231 may be partially disposed at the source-drain metal layer and partially disposed at the gate layer. For example, the first power supply leads 231 are distributed in a grid shape, and the portions extending along the column direction may be disposed at the source and drain metal layers, and the portions extending along the row direction may be disposed at the gate electrode layer.

Figure 9:
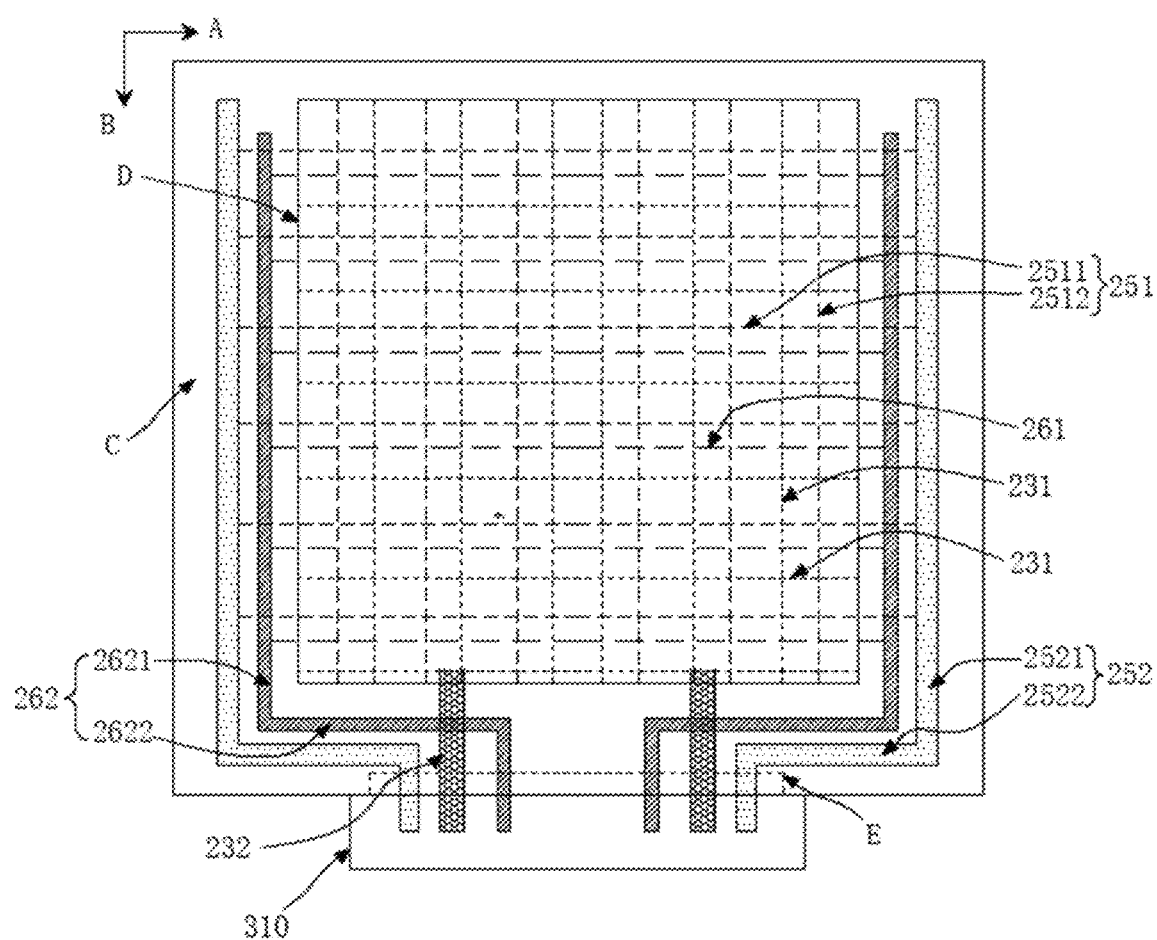
FIG. 9 is a schematic structural diagram of a display panel provided by the present disclosure, in which only part of the leads are shown.
Figure 10:
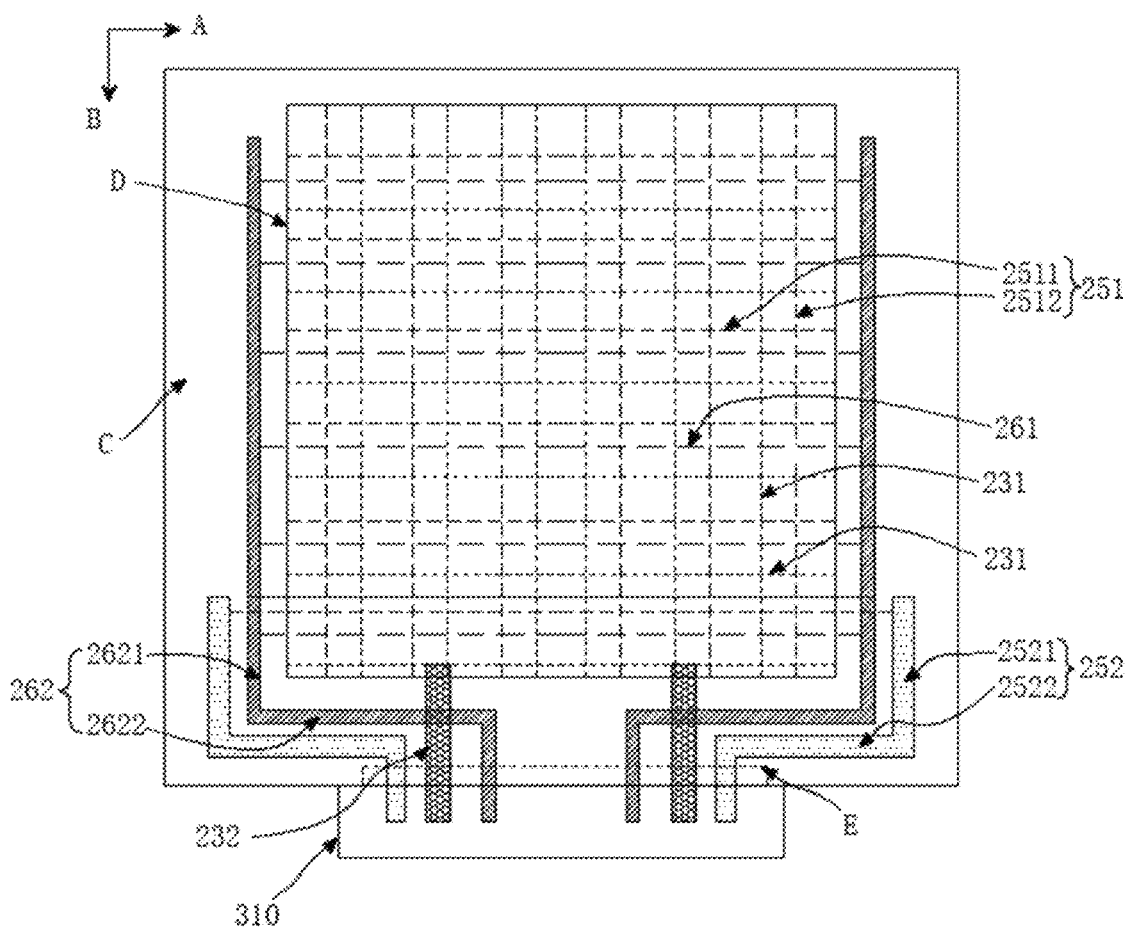
FIG. 10 is a schematic structural diagram of a display panel provided by the present disclosure, in which only part of the leads is shown.

In an implementation manner of the present disclosure, referring to FIG. 9 and FIG. 10, the display panel may also be provided with a first power supply bus 232. The first power supply bus 232 is disposed in the peripheral area C, and one end thereof is extended to the bonding area E. The first power supply bus 232 can be connected to the bonding pad in the binding area E, and by virtue of the binding connection of the circuit board and the display panel in the bonding area E, the first power supply bus 232 circuitry extended to the circuit board, so as to receive the first power supply voltage VDD from the circuit board. The first power supply bus 232 is connected to the first power lead 231 for loading the first power voltage VDD and distributing the first power voltage VDD to each first power lead 231.

In an implementation manner of the present disclosure, referring to FIG. 9 and FIG. 10, the number of the first power supply buses 232 may be two, and the two first power supply buses 232 may be symmetrically distributed.

In one embodiment of the present disclosure, the first power supply bus 232 is disposed at the source-drain metal layer.

Referring to FIGS. 6 to 8, the display panel may further be provided with a second power supply lead 251 for applying the second power supply voltage VSS, and the second power supply lead 251 is electrically connected to the fourth node N4 of the pixel driving circuit.

Optionally, referring to FIG. 9 and FIG. 10, there are multiple second power leads 251. Referring to FIG. 6 to FIG. 8, any second power lead 251 is extended along the row direction A or along the column direction B. Further optionally, any pixel driving circuit area has a second power lead 251 passing through it.

In one embodiment of the present disclosure, referring to FIG. 9 and FIG. 10, the second power supply lead 251 includes a plurality of second power supply row sub-leads 2511 extending along the row direction A and a plurality of second power supply column sub-leads 2512 extending along the column direction B; the second power supply row sub-leads 2511 and the second power column sub-leads 2512 are connected to each other, so that the respective second power supply lead 251 is in a grid shape. In this way, the second power lead 251 is designed in a grid shape, which can improve the uniformity of the second power supply voltage VSS in the display panel, reduce the voltage drop of the second power supply voltage VSS, and further improve the brightness uniformity of the display panel.

The second power lead 251 may be disposed at the source-drain metal layer, for example, may cross and extend between the first source-drain metal layer and the second source-drain metal layer. Of course, it can be understood that the second power lead 251 may also be partially disposed at other film layers, for example, may be partially disposed at film layers such as semiconductor layers, gate layers, and pixel electrode layers.

Optionally, referring to FIG. 9 and FIG. 10, the peripheral area C is provided with a second power supply bus 252, and the second power supply bus 252 is connected to at least part of the second power leads 251. Referring to FIG. 9 and FIG. 10, the second power supply bus 252 is electrically connected to the binding area E, and can be loaded with the second power supply voltage VSS, and then distribute the second power supply voltage VSS to the second power supply leads 251. It can be understood that if some of the second power leads 251 are not directly connected to the second power supply bus 252, they can be electrically connected to the second power supply bus 252 through other conductive structures, such as other second power leads 251.

Optionally, the number of the second power supply bus 252 is two, and they are arranged symmetrically.

In one embodiment of the present disclosure, the second power supply bus 252 has a wiring segment 2521 and a connecting segment 2522 connected to each other; the number of the second power supply bus 252 is two, and the wiring segments 2521 of the two second power supply buses 252 extend along the column direction B and are respectively located on two sides of the display area D; the connecting segment 2522 of the second power supply bus 252 is extended to the bonding area E.

In this embodiment, optionally, the common electrode of the display panel may cover the display area and extend to the peripheral area, and partially overlap the wiring segment 2521 of the second power supply bus 252, so that the second power supply bus 252 can apply the second power supply voltage VSS to the common electrode. Further, the pixel electrode layer can be provided with an interconnecting electrode, the interconnecting electrode can be connected to the second power supply bus 252 through a via hole, and the common electrode can be connected to the interconnecting electrode, thereby realizing the electrical connection between the common electrode and the second power supply bus 252.

In one embodiment of the present disclosure, referring to FIG. 9 and FIG. 10, the wiring segment 2521 of the second power supply bus 252 is extended along the column direction B; and at least part of the second power lead 251 is extended along the row direction A to connect with the wiring segments 2521 of the two second power buses 252. In this way, the second power supply voltage VSS may be loaded to the second power supply lead 251 by the low-impedance second power supply bus 252, thereby further improving the uniformity of the second power supply voltage VSS.

For example, referring to FIG. 9, the part of the second power lead 251 extending along the row direction A, such as the respective second power row sub-lead 2511, is connected to two wiring segments 2521 of the second power supply bus 252 at both ends.

In another implementation manner of the present disclosure, referring to FIG. 10, the wiring segment 2521 of the second power supply bus 252 is located at an end of the display panel close to the bonding area E. In other words, the length of the wiring segment 2521 of the second power supply bus 252 is shorter than the length of the display area D in the column direction B, and the wiring segment 2521 of the second power supply bus 252 is only provided on one side close to the bonding area E. This arrangement can reduce the extension length of the wiring segment 2521 of the second power supply bus 252, thereby reducing the frame space occupied by the wiring segment 2521 of the second power supply bus 252, and further reducing the frame of the display panel.

Exemplarily, the wiring segment 2521 of the second power supply bus 252 may only be located at the corner of the display panel near the binding area E, that is, outside the two corners of the display area D close to the binding area E. In this way, the wiring segment 2521 of the second power supply bus 252 does not extend further along the column direction B, thereby significantly reducing the frame width of the display panel. The second power supply leads 251 can be distributed in grid form and electrically connected to the wiring segment 2521 of the second power supply bus 252 to ensure that the second power supply voltage VS S can be applied to the fourth node N4 of each pixel driving circuit.

In this disclosure, a node refers to a conductive structure that has equipotential and is electrically connected to each other. The conductive structure can be the same conductive structure located in the same film layer, can be different conductive structures located in the same film layer, or can be different conductive structures located in different layers.

Figure 2:
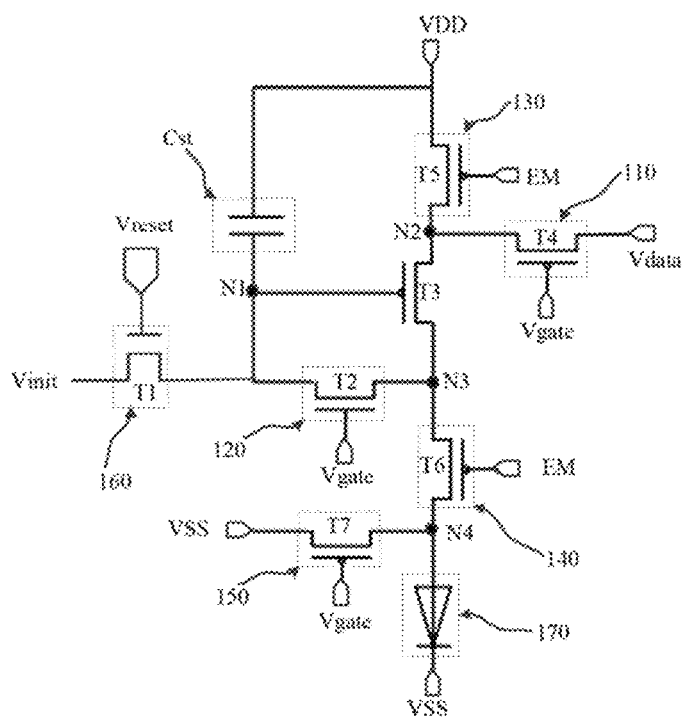
FIG. 2 is a schematic structural diagram of a pixel driving circuit provided by the present disclosure.

In one embodiment of the present disclosure, referring to FIG. 2, the data writing unit 110 includes a data writing transistor T4. The data writing transistor T4 has a first terminal, a second terminal and a control terminal. The first terminal of the data writing transistor T4 is used to load the data voltage Vdata, the second terminal of the data writing transistor T4 is connected to the second node N2, and the control terminal of the data writing transistor T4 is used to load the scan signal Vgate.

Optionally, the first terminal of the data writing transistor T4 may be electrically connected to the data lead 220, and the control terminal of the data writing transistor T4 may be electrically connected to the scan lead 210.

In this disclosure, the control terminal of the transistor is electrically connected to the scan lead 210, which may mean that the gate of the transistor is multiplexed as a part of the scan lead 210 (that is, the scan lead 210 overlaps with the active layer of the transistor), or may mean that the gate of the transistor is directly or indirectly connected to the scan lead 210.

In an embodiment of the present disclosure, the threshold compensation unit 120 includes a threshold compensation transistor T2, the threshold compensation transistor T2 has a first terminal, a second terminal and a control terminal, and the first terminal of the threshold compensation transistor T2 is connected to the first node N1, the second terminal of the threshold compensation transistor T2 is connected to the third node N3, and the control terminal of the threshold compensation transistor T2 is used to load the scan signal Vgate.

Optionally, the control terminal of the threshold compensation transistor T2 is electrically connected to the scan lead 210.

In an implementation manner of the present disclosure, the first light emitting control unit 130 includes a first light emitting control transistor T5, and the first light emitting control transistor T5 has a first terminal, a second terminal and a control terminal. The first terminal of the first light emitting control transistor T5 is used to load the first power supply voltage VDD, the second terminal of the first light emitting control transistor T5 is connected to the second node N2, and the control terminal of the first light emitting control transistor T5 is used to load the light emitting control signal EM.

Optionally, the first terminal of the first light emitting control transistor T5 is electrically connected to the first power lead 231, and the control terminal of the first light emitting control transistor T5 is electrically connected to the light emitting control lead 240.

In the present disclosure, the control terminal of the transistor is electrically connected to the light emitting control lead 240, which may mean that the gate of the transistor is multiplexed as a part of the light emitting control lead 240 (that is, the light emitting control lead 240 overlaps with the active layer of the transistor), or may mean that the gate of the transistor is directly or indirectly connected to the light emitting control lead 240.

In one embodiment of the present disclosure, the second light emitting control unit 140 includes a second light emitting control transistor T6, the second light emitting control transistor T6 has a first terminal, a second terminal and a control terminal, and the first terminal of the second light emitting control transistor T6 is connected to the third node N3, the second terminal of the second light emitting control transistor T6 is connected to the fourth node N4, and the control terminal of the second light emitting control transistor T6 is used to load the light emitting control signal EM.

Optionally, the second terminal of the second light emitting control transistor T6 is connected to the pixel electrode, and the pixel electrode may be part of the fourth node N4 of the present disclosure; and the control terminal of the second light emitting control transistor T6 is electrically connected to the light emitting control lead 240.

In an embodiment of the present disclosure, the first reset unit 150 includes a first reset transistor T7. The first reset transistor T7 has a first terminal, a second terminal and a control terminal. The first terminal of the first reset transistor T7 is used to load the second power supply voltage VSS, the second terminal of the first reset transistor T7 is connected to the fourth node N4, and the control terminal of the first reset transistor T7 is used to load the scan signal Vgate.

Optionally, the first terminal of the first reset transistor T7 is electrically connected to the second power lead 251, the second terminal of the first reset transistor T7 is electrically connected to the pixel electrode, and the control terminal of the first reset transistor T7 is electrically connected to the scan lead 210.

In the display panel provided by the present disclosure, one terminal of the storage capacitor Cst is electrically connected to the first node N1, and the other terminal can be used for loading the first power supply voltage VDD, and can also be used for loading the second power supply voltage VS S.

Optionally, referring to FIG. 1, the pixel driving circuit further includes a second reset unit 160 connected to the first node N1 for applying an initialization voltage Vinit to the first node N1 in response to the reset control signal Vreset. In this way, the pixel driving circuit can also reset the first node N1 to improve the stability and uniformity of the operation of each display driving circuit.

In an implementation manner of the present disclosure, referring to FIG. 2, the second reset unit 160 may include a second reset transistor T1, and the second reset transistor T1 has a first terminal, a second terminal and a control terminal, wherein the first terminal of the second reset transistor T1 is used to load the initialization voltage Vinit, the second terminal of the second reset transistor T1 is electrically connected to the first node N1, and the control terminal of the second reset transistor T1 is used to load the reset control signal Vreset.

In an implementation manner of the present disclosure, referring to FIGS. 6 to 10, the display panel may be provided with a reset control lead 270 for loading the reset control signal Vreset. Optionally, the reset control lead 270 may extend along the row direction A and be electrically connected to the gate of the second reset transistor T1.

Further optionally, the reset control lead 270 may be disposed at the gate layer.

In one embodiment of the present disclosure, the display panel may be provided with an initialization lead 261, which is used to load the initialization voltage Vinit. Optionally, the initialization lead 261 may extend along the row direction A and be electrically connected to the first terminal of the second reset transistor T1. For example, the initialization lead 261 may run through the display area D along the row direction A.

Further optionally, the initialization lead 261 may be provided at the source-drain metal layer.

Optionally, referring to FIG. 9 and FIG. 10, the display panel can also be provided with an initialization bus 262, and the initialization bus 262 is used to load the initialization voltage Vinit; the number of the initialization bus 262 is two, and the initialization bus 262 is located in the peripheral area C, and the initialization bus 262 includes interconnected wiring segment 2621 and connecting segment 2622; the wiring segments 2621 of the two initialization buses 262 is extended along the column direction B and are respectively located on both sides of the display area D; the connecting segment 2622 of the initialization bus 262 is extended to the binding region E. The initialization lead 261 runs through the display area D along the row direction A and is connected to the wiring segment 2621 of the initialization bus 262.

In this way, the initialization bus 262 can distribute the initialization voltage Vinit to each initialization lead 261 and improve the uniformity of the initialization voltage Vinit.

Optionally, referring to FIG. 9 and FIG. 10, the initialization bus 262 is located between the second power supply bus 252 and the display area D.

Optionally, referring to FIG. 9 and FIG. 10, at a position close to the bonding area E, the connecting segment 2622 of the two initialization buses 262 is located at the inner side of the two first power supply buses 232. At a position close to the display area D, the connecting segments 2622 of the two initialization buses 262 are bent to both sides of the row direction A of the display panel, which makes the connecting segments 2622 of the two initialization buses 262 partially overlap with the first power supply bus 232.

In one embodiment of the present disclosure, referring to FIG. 6 to FIG. 8, within the range of a pixel driving circuit, along the column direction, the scan lead 210, the first power supply lead 231, the light emitting control lead 240, the initialization lead 261 and the reset control lead 270 are arranged sequentially.

Figure 5:
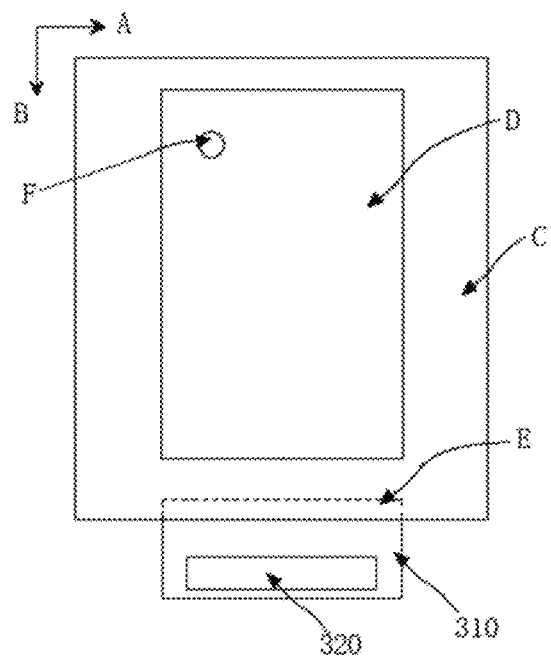
FIG. 5 is a schematic structural diagram of a display panel provided by the present disclosure.

In one embodiment of the present disclosure, referring to FIG. 4 and FIG. 5, the display panel is provided with a through hole F in the display area D. In this implementation manner, there will be no abnormal light emission in the respective pixels around the through hole F and the respective pixels disposed in the same row with the through hole F, thereby avoiding the problem of light spots (Hole Mura) around the through hole F. The pixel driving circuit of the present disclosure uses the second power supply voltage VSS to initialize the fourth node N4 of the pixel driving circuit; compared with the conventional initialization voltage Vinit, the distribution of the second power supply voltage VSS is more uniform and the voltage drop is smaller, which is less affected by the magnitude of the load (the number of light emitting elements 170). In this way, this overcomes the problem in the related art that the initialization voltage Vinit around the through-hole F have an obvious voltage difference due to the difference in the distribution number of the light-emitting elements 170 (the voltage difference can reach 0.2V), and improves the brightness uniformity of the screen with aperture.

Implementations of the present disclosure further provide a display device, which includes any display panel described in the above display panel embodiments. The display device may be a smart watch screen, a smart phone screen or other types of display devices. Since the display device has any one of the display panels described in the above display panel implementation manners, it has the same beneficial effect, which will not be repeated here in the present disclosure.

Other embodiments of the present disclosure will be readily apparent to those skilled in the art from consideration of the specification and practice of the invention disclosed herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and examples are to be considered exemplary only, with the true scope and spirit of the disclosure indicated by the appended claims.

What is claimed is:

1. A pixel driving circuit, comprising:

a driving transistor connected to a first node, a second node and a third node, and configured to output a driving current to the third node under control of the first node;

a storage capacitor, comprising one terminal connected to the first node;

a data writing circuit, connected to the second node, and configured to load a data voltage to the second node in response to a scan signal;

a threshold compensation circuit, connected to the first node and the third node, and configured to conduct the first node and the third node in response to the scan signal;

a first light emitting control circuit, connected to the second node, and configured to apply a first power supply voltage to the second node in response to a light emitting control signal;

a second light emitting control circuit, connected to the third node and a fourth node, and configured to conduct the third node and the fourth node in response to the light emitting control signal;

a first reset circuit, connected to the fourth node, and configured to apply a second power supply voltage to the fourth node in response to the scan signal; and a light emitting element, one terminal of the light emitting element is connected to the fourth node, and the other terminal is configured to load the second power supply voltage, wherein the pixel driving circuit comprises a first power supply lead configured to load the first power supply voltage and a second power supply lead configured to load the second power supply voltage, wherein the first power supply lead comprises a first part extending in a first direction and a second part extending in a second direction, and the first part and the second part are formed in different conductive layers and are interconnected to form a grid shaped electrode; and wherein the second power supply lead comprises a first part extending in the first direction and a second part extending in the second direction, and the first part and the second part are formed in different conductive layers and are interconnected to form a grid shaped electrode.

2. The pixel driving circuit according to claim 1, wherein,
the data writing circuit comprises a data writing transistor, the data writing transistor has a first terminal, a second terminal and a control terminal, the first terminal of the data writing transistor is configured to load the data voltage, the second terminal of the data writing transistor is connected to the second node, and the control terminal of the data writing transistor is configured to load the scan signal;
the threshold compensation circuit comprises a threshold compensation transistor, the threshold compensation transistor has a first terminal, a second terminal and a control terminal, the first terminal of the threshold compensation transistor is connected to the first node, the second terminal of the threshold compensation transistor is connected to the third node, and the control terminal of the threshold compensation transistor is configured to load the scan signal;
the first light emitting control circuit comprises a first light emitting control transistor, the first light emitting control transistor has a first terminal, a second terminal and a control terminal, and the first terminal of the first light emitting control transistor is configured to load the first power supply voltage, the second terminal of the first light emitting control transistor is connected to the second node, and the control terminal of the first light emitting control transistor is configured to load the light emitting control signal;
the second light emitting control circuit comprises a second light emitting control transistor, the second light emitting control transistor has a first terminal, a second terminal and a control terminal, and the first terminal of the second light emitting control transistor is connected to the third node, the second terminal of the second light emitting control transistor is connected to the fourth node, and the control terminal of the second light emitting control transistor is configured to load the light emitting control signal; and
the first reset circuit comprises a first reset transistor, the first reset transistor has a first terminal, a second terminal and a control terminal, the first terminal of the first reset transistor is configured to load the second power supply voltage, the second terminal of the first reset transistor is connected to the fourth node, and the control terminal of the first reset transistor is configured to load the scan signal.

3. The pixel driving circuit according to claim 1, wherein the pixel driving circuit further comprises a second reset circuit, connected to the first node and configured to apply an initialization voltage to the first node in response to a reset signal.

4. A display panel, comprising a pixel driving circuit, wherein the pixel driving circuit comprises:
a driving transistor connected to a first node, a second node and a third node, and configured to output a driving current to the third node under control of the first node;
a storage capacitor, comprising one terminal connected to the first node;
a data writing circuit, connected to the second node, and configured to load a data voltage to the second node in response to a scan signal;
a threshold compensation circuit, connected to the first node and the third node, and configured to conduct the first node and the third node in response to the scan signal;
a first light emitting control circuit, connected to the second node, and configured to apply a first power supply voltage to the second node in response to a light emitting control signal;
a second light emitting control circuit, connected to the third node and a fourth node, and configured to conduct the third node and the fourth node in response to the light emitting control signal;
a first reset circuit, connected to the fourth node, and configured to apply a second power supply voltage to the fourth node in response to the scan signal; and
a light emitting element, one terminal of the light emitting element is connected to the fourth node, and the other terminal is configured to load the second power supply voltage,
wherein the pixel driving circuit comprises a first power supply lead configured to load the first power supply voltage and a second power supply lead configured to load the second power supply voltage,
wherein the first power supply lead comprises a first part extending in a first direction and a second part extending in a second direction, and the first part and the second part are formed in different conductive layers and are interconnected to form a grid shaped electrode; and wherein the second power supply lead comprises a first part extending in the first direction and a second part extending in the second direction, and the first part and the second part are formed in different conductive layers and are interconnected to form a grid shaped electrode.

5. The display panel according to claim 4, wherein the display panel comprises a display area and a peripheral area surrounding the display area; and
the second power supply lead is formed in the display area, and the second power supply lead is electrically connected to the fourth node of the pixel driving circuit.

6. The display panel according to claim 5, wherein a number of the second power supply lead is plural, and wherein the first direction is a row direction and the second direction is a column direction.

7. The display panel according to claim 5, wherein the peripheral area comprises a second power supply bus, and the second power supply bus is connected to at least part of the second power supply lead.

8. The display panel according to claim 7, wherein the peripheral area has a binding area; the second power supply bus has a wiring segment and a connecting segment connected to each other; a number of the second power supply bus is two, the wiring segments of the two second power supply buses are all extend along the column direction and are respectively located on two sides of the display area; and the connecting segment of the second power supply bus extends to the bonding area.

9. The display panel according to claim 8, wherein the wiring segment of the second power supply bus is located at an end of the display panel close to the bonding area.

10. The display panel according to claim 5, wherein the pixel driving circuit comprises a second reset circuit, and the peripheral area of the display panel comprises a binding area; the display panel is further configured with:
an initialization bus, configured to load the initialization voltage; a number of the initialization bus is two and are disposed in the peripheral area, and the initialization bus comprises a wiring segment and a connecting segment connected to each other; the wiring segments of the two initialization buses are all extend along the column direction and are respectively located on two sides of the display area; and the connecting segment of the initialization bus extends to the bonding area;

an initialization lead, running through the display area along a row direction and connected to the wiring segment of the initialization bus;

a first power supply bus, configured to load the first power supply voltage; a number of the first power supply buses is two and are disposed in the peripheral area, one terminal of the first power supply bus is extended to the bonding area; and the first power lead are arranged in the display area, and is connected to the first power supply bus;

wherein the first power supply bus is partially overlapped with the initialization bus.

11. A display device, comprising a display panel, wherein the display panel comprises a pixel driving circuit which comprises:

a driving transistor connected to a first node, a second node and a third node, and configured to output a driving current to the third node under control of the first node;

a storage capacitor, comprising one terminal connected to the first node;

a data writing circuit, connected to the second node, and configured to load a data voltage to the second node in response to a scan signal;

a threshold compensation circuit, connected to the first node and the third node, and configured to conduct the first node and the third node in response to the scan signal;

a first light emitting control circuit, connected to the second node, and configured to apply a first power supply voltage to the second node in response to a light emitting control signal;

a second light emitting control circuit, connected to the third node and a fourth node, and configured to conduct the third node and the fourth node in response to the light emitting control signal;

a first reset circuit, connected to the fourth node, and configured to apply a second power supply voltage to the fourth node in response to the scan signal; and a light emitting element, one terminal of the light emitting element is connected to the fourth node, and the other terminal is configured to load the second power supply voltage, wherein the pixel driving circuit comprises a first power supply lead configured to load the first power supply voltage and a second power supply lead configured to load the second power supply voltage, wherein the first power supply lead comprises a first part extending in a first direction and a second part extending in a second direction, and the first part and the second part are formed in different conductive layers and are interconnected to form a grid shaped electrode; and wherein the second power supply lead comprises a first part extending in the first direction and a second part extending in the second direction, and the first part and the second part are formed in different conductive layers and are interconnected to form a grid shaped electrode.

12. The display device according to claim 11, wherein, the data writing circuit comprises a data writing transistor, the data writing transistor has a first terminal, a second terminal and a control terminal, the first terminal of the data writing transistor is configured to load the data voltage, the second terminal of the data writing transistor is connected to the second node, and the control terminal of the data writing transistor is configured to load the scan signal;

the threshold compensation circuit comprises a threshold compensation transistor, the threshold compensation transistor has a first terminal, a second terminal and a control terminal, the first terminal of the threshold compensation transistor is connected to the first node, the second terminal of the threshold compensation transistor is connected to the third node, and the control terminal of the threshold compensation transistor is configured to load the scan signal;

the first light emitting control circuit comprises a first light emitting control transistor, the first light emitting control transistor has a first terminal, a second terminal and a control terminal, and the first terminal of the first light emitting control transistor is configured to load the first power supply voltage, the second terminal of the first light emitting control transistor is connected to the second node, and the control terminal of the first light emitting control transistor is configured to load the light emitting control signal;

the second light emitting control circuit comprises a second light emitting control transistor, the second light emitting control transistor has a first terminal, a second terminal and a control terminal, and the first terminal of the second light emitting control transistor is connected to the third node, the second terminal of the second light emitting control transistor is connected to the fourth node, and the control terminal of the second light emitting control transistor is configured to load the light emitting control signal; and the first reset circuit comprises a first reset transistor, the first reset transistor has a first terminal, a second terminal and a control terminal, the first terminal of the first reset transistor is configured to load the second power supply voltage, the second terminal of the first reset transistor is connected to the fourth node, and the control terminal of the first reset transistor is configured to load the scan signal.

13. The display device according to claim 11, wherein the pixel driving circuit further comprises a second reset circuit, connected to the first node and configured to apply an initialization voltage to the first node in response to a reset signal.

14. The display device according to claim 11, wherein the display panel comprises a display area and a peripheral area surrounding the display area; and the second power supply lead is formed in the display area, and the second power supply lead is electrically connected to the fourth node of the pixel driving circuit.

15. The display device according to claim 14, wherein a number of the second power supply lead is plural, and wherein the first direction is a row direction and the second direction is a column direction.

16. The display device according to claim 14, wherein the peripheral area comprises a second power supply bus, and the second power supply bus is connected to at least part of the second power lead.

17. The display device according to claim 16, wherein the peripheral area has a binding area; the second power supply bus has a wiring segment and a connecting segment connected to each other; a number of the second power supply bus is two, the wiring segments of the two second power supply buses are all extend along the column direction and are respectively located on two sides of the display area; and the connecting segment of the second power supply bus extends to the bonding area.

18. The display device according to claim 17, wherein the wiring segment of the second power supply bus is located at an end of the display panel close to the bonding area.

\* \* \* \* \*